United States Patent
Yun et al.

(10) Patent No.: US 7,928,736 B2
(45) Date of Patent: Apr. 19, 2011

(54) METHOD OF ESTIMATING STATE OF CHARGE FOR BATTERY AND BATTERY MANAGEMENT SYSTEM USING THE SAME

(75) Inventors: Han-Seok Yun, Suwon-si (KR); Se-Wook Seo, Suwon-si (KR); Gye-Jong Lim, Suwon-si (KR)

(73) Assignee: Samsung SDI Co., Ltd., Gongse-dong, Giheung-gu, Yongin-si, Gyeonggi-do (KR)

( * ) Notice: Subject to any disclaimer, the term of this patent is extended or adjusted under 35 U.S.C. 154(b) by 540 days.

(21) Appl. No.: 11/583,118

(22) Filed: Oct. 19, 2006

(65) Prior Publication Data
US 2007/0090803 A1    Apr. 26, 2007

(30) Foreign Application Priority Data
Oct. 20, 2005    (KR) .................. 10-2005-0099088

(51) Int. Cl.
*G01N 27/416* (2006.01)
(52) U.S. Cl. ........................ 324/428; 320/149
(58) Field of Classification Search .................. 320/132, 320/149; 324/426, 427, 428
See application file for complete search history.

(56) References Cited

U.S. PATENT DOCUMENTS

| | | |
|---|---|---|
| 5,153,496 A | 10/1992 | LaForge |
| 5,321,627 A | 6/1994 | Reher |
| 5,666,040 A | 9/1997 | Bourbeau |
| 5,701,068 A | 12/1997 | Baer et al. |
| 5,773,959 A | 6/1998 | Merritt et al. |
| 5,773,962 A | 6/1998 | Nor |
| 5,796,334 A | 8/1998 | Chen et al. |
| 5,952,815 A | 9/1999 | Rouillard et al. |
| 6,014,013 A | 1/2000 | Suppanz et al. |
| 6,078,165 A | 6/2000 | Ashtiani et al. |

(Continued)

FOREIGN PATENT DOCUMENTS

CN    1415973    5/2003

(Continued)

OTHER PUBLICATIONS

State of charge (Wikipedia—2 pages) print out from http://en.wikipedia.org/wiki/State_of_charge.

(Continued)

*Primary Examiner* — Edward Tso
*Assistant Examiner* — Ramy Ramadan
(74) *Attorney, Agent, or Firm* — Robert E. Bushnell, Esq.

(57) ABSTRACT

The battery management system (BMS) measures a state of charge (SOC) of a battery by using a total amount of charge corresponding to a total amount of discharge accumulation. The BMS, outputting a SOC of a battery to an engine control unit (ECU), includes a sensor, state of health (SOH) and SOC measurers, a total amount of charge (TAC) determiner, and an output unit. The sensor detects a pack current and a pack voltage of the battery. The SOH measurer outputs a SOH of the battery by using the pack current and voltage. The SOC measurer measures a SOC of the battery by using the pack current and a TAC of the battery. The TAC determiner accumulates a total amount of discharge accumulation by using the pack current, determines a TAC corresponding to the total amount of discharge accumulation, and delivers the determined TAC to the SOC measurer. The output unit outputs the SOC and SOH to the ECU.

13 Claims, 4 Drawing Sheets

U.S. PATENT DOCUMENTS

| | | | |
|---|---|---|---|
| 6,104,166 A | 8/2000 | Kikuchi et al. | |
| 6,127,806 A | 10/2000 | Tanjo et al. | |
| 6,157,169 A | 12/2000 | Lee | |
| 6,255,826 B1 | 7/2001 | Ohsawa et al. | |
| 6,300,763 B1 | 10/2001 | Kwok | |
| 6,336,063 B1 | 1/2002 | Lennevi | |
| 6,377,030 B1 | 4/2002 | Asao et al. | |
| 6,411,063 B1 | 6/2002 | Kouzu et al. | |
| 6,472,880 B1 | 10/2002 | Kang | |
| 6,531,874 B2 | 3/2003 | Mentgen et al. | |
| 6,621,250 B1 | 9/2003 | Ohkubo et al. | |
| 6,639,409 B2 | 10/2003 | Morimoto et al. | |
| 6,803,766 B2 | 10/2004 | Kobayashi et al. | |
| 7,019,472 B2 * | 3/2006 | Kayukawa et al. | 318/139 |
| 7,085,661 B2 * | 8/2006 | Emori et al. | 702/63 |
| 7,126,342 B2 | 10/2006 | Iwabuchi et al. | |
| 7,443,139 B2 * | 10/2008 | Mitsui et al. | 320/134 |
| 2001/0035737 A1 | 11/2001 | Nakanishi et al. | |
| 2002/0030494 A1 | 3/2002 | Araki et al. | |
| 2002/0113595 A1 | 8/2002 | Sakai et al. | |
| 2003/0025481 A1 | 2/2003 | Bertness | |
| 2003/0146737 A1 | 8/2003 | Kadouchi et al. | |
| 2003/0189419 A1 | 10/2003 | Maki et al. | |
| 2004/0070353 A1 * | 4/2004 | Kayukawa et al. | 318/139 |
| 2004/0109274 A1 | 6/2004 | Sato | |
| 2005/0119856 A1 * | 6/2005 | Emori et al. | 702/127 |
| 2005/0156603 A1 | 7/2005 | Lin et al. | |
| 2005/0269991 A1 * | 12/2005 | Mitsui et al. | 320/132 |
| 2006/0028179 A1 | 2/2006 | Yudahira et al. | |
| 2006/0181245 A1 | 8/2006 | Mizuno et al. | |
| 2006/0202663 A1 | 9/2006 | Cho et al. | |
| 2007/0090803 A1 | 4/2007 | Yun et al. | |
| 2008/0077339 A1 | 3/2008 | Seo et al. | |
| 2008/0091364 A1 | 4/2008 | Lim et al. | |

FOREIGN PATENT DOCUMENTS

| | | |
|---|---|---|
| CN | 1604383 | 4/2005 |
| DE | 100 56 971 A1 | 5/2002 |
| EP | 0990913 | 4/2000 |
| EP | 1081499 | 3/2001 |
| EP | 1203964 | 5/2002 |
| EP | 1 271 171 A2 | 1/2003 |
| EP | 1 314 992 A2 | 5/2003 |
| EP | 1 555 537 A1 | 7/2005 |
| EP | 1841003 | 10/2007 |
| JP | 6231806 | 8/1994 |
| JP | 10104325 A * | 4/1998 |
| JP | 11-160367 | 6/1999 |
| JP | 2000-069606 | 3/2000 |
| JP | 2000-134705 | 5/2000 |
| JP | 2000-217261 | 8/2000 |
| JP | 2000-228832 | 8/2000 |
| JP | 2000-324702 | 11/2000 |
| JP | 2000-340267 | 12/2000 |
| JP | 2000-357541 | 12/2000 |
| JP | 2001-086656 | 3/2001 |
| JP | 2001-116776 | 4/2001 |
| JP | 2002-042906 | 2/2002 |
| JP | 2002-199510 | 7/2002 |
| JP | 2003-084015 | 3/2003 |
| JP | 2003-134675 | 5/2003 |
| JP | 2004-079324 | 3/2004 |
| JP | 2004-180397 | 6/2004 |
| JP | 2004-222433 | 8/2004 |
| JP | 2005-269752 | 9/2005 |
| JP | 2006-047130 | 2/2006 |
| JP | 2006-014480 | 12/2006 |
| KR | 10-1992-0009697 | 2/1991 |
| KR | 10-1997-0048597 | 7/1997 |
| KR | 1998-064646 | 10/1998 |
| KR | 10-0216808 | 6/1999 |
| KR | 10-2001-0043872 | 5/2001 |
| KR | 10-2002-0064998 | 8/2002 |
| KR | 2003-0065757 | 8/2003 |
| KR | 10-2004-0005133 | 1/2004 |
| KR | 10-2004-0092943 | 11/2004 |
| KR | 10-2004-0111144 | 12/2004 |
| KR | 10-2005-0019856 | 3/2005 |
| KR | 10-2005-0026360 | 3/2005 |
| KR | 10-2005-0089816 | 9/2005 |
| KR | 10-0534818 | 12/2005 |
| KR | 10-2006-0059680 | 6/2006 |
| KR | 10-2006-0094897 | 8/2006 |
| KR | 10-2007-0003628 | 1/2007 |
| KR | 10-2007-0029937 | 3/2007 |
| KR | 10-2006-0079505 | 7/2008 |
| WO | WO 0151947 | 7/2001 |
| WO | 2007/007655 | 1/2007 |

OTHER PUBLICATIONS

Custom Power Solutions (10 pages) print out from http://www.mpoweruk.com/soc.htm.

U.S. Appl. No. 11/583,113, filed Oct. 19, 2006, Se-Wook Seo.

European Office Action issued by European Patent Office on Jan. 7, 2011 corresponding to Korean Patent Application No. 2005-0099088.

* cited by examiner

METHOD OF ESTIMATING STATE OF CHARGE FOR BATTERY AND BATTERY MANAGEMENT SYSTEM USING THE SAME

CLAIM OF PRIORITY

This application makes reference to, incorporates the same herein, and claims all benefits accruing under 35 U.S.C. §119 from an application earlier filed in the Korean Intellectual Property Office on 20 Oct. 2005 and there duly assigned Serial No. 10-2005-0099088.

BACKGROUND OF THE INVENTION

1. Field of the Invention

The present invention relates to a battery management system. More particularly, the present invention relates to a battery management system that is applied to a vehicle that uses electric energy, and a driving method thereof 2. Description of the Related Art Vehicles with an internal combustion engine using gasoline or diesel have caused serious air pollution. Accordingly, various undertakings for developing electric or hybrid vehicles have recently been made to reduce such air pollution.

An electric vehicle is run by electric energy outputted from a battery. Since the electric vehicle mainly uses a battery formed by one battery pack that includes a plurality of rechargeable/dischargeable secondary cells, the electric vehicle has an advantage that it produces no emission gas and makes less noise.

In addition, a hybrid vehicle commonly refers to a gasoline-electric hybrid vehicle that uses gasoline to power an internal-combustion engine and an electric battery to power an electric motor. Recently, hybrid vehicles using an internal-combustion engine and fuel cells, and hybrid vehicles using a battery and fuel cells have been developed. The fuel cells directly obtain electricity by generating a chemical reaction while hydrogen and oxygen are continuously provided.

Since performance of a battery directly affects performance of a vehicle that is driven by electrical energy provided from the battery, it is required that each battery cell has great performance. Also, it is required to provide a battery management system that measures voltage and current of the entire battery to efficiently manage charging/discharging operations of each battery cell.

The above information disclosed in this Background section is only for enhancement of understanding of the background of the invention, and therefore it may contain information that does not form prior art that is already known in this country to a person of ordinary skill in the art.

SUMMARY OF THE INVENTION

The present invention has been made in an effort to provide measurement method of a state of charge (SOC) of a battery having advantages of accuracy, and a battery management system using the same. In addition, the present invention provides a battery management system for measuring a SOC of a battery by using a total amount of charge that is obtained from a total amount of discharge accumulation.

An exemplary battery management system according to an embodiment of the present invention outputs a SOC value of a battery to an engine control unit (ECU) of a vehicle that uses electrical energy. The battery management system includes a sensor, a state of health (SOH) measurer, a SOC measurer, a total amount of charge (TAC) determiner, and an output unit. The sensor detects a pack current and a pack voltage of the battery. The SOH measurer outputs a SOH of the battery by using the pack current and the pack voltage. The SOC measurer calculates a SOC of the battery by using the pack current and a TAC of the battery, and outputs the calculated value of SOC. The TAC determiner determines a total amount of discharge accumulation by using the pack current, determines a TAC corresponding to the total amount of discharge accumulation, and delivers the determined TAC to the SOC measurer. The output unit outputs the measured SOC and SOH to the ECU.

The TAC determiner includes a total amount of discharge accumulator and a look-up table (LUT). The total amount of discharge accumulator determines the amount of discharge based on a discharge time period and a discharge pack current, and calculates a total amount of discharge accumulation by accumulating the calculated amount of discharge. The LUT stores a relationship between a TAC and the total amount of discharge accumulation. The battery management system periodically delivers the TAC to the SOC measurer.

An exemplary method for measuring a SOC of a battery is employed in a battery management system according to an embodiment of the present invention. In the method, a pack voltage and a pack current of the battery are measured, a total amount of discharge accumulation of the battery is measured by using the measured pack current, a TAC that corresponds to the total amount of discharge accumulation is determined, and a SOC of the battery is determined on the basis of the TAC and the pack current. In determining the TAC, LUT may be looked up. The TAC may be determined to be a value that corresponds to the total amount of discharge accumulation from a relationship stored in the LUT.

An exemplary recording medium according to an embodiment of the present invention performs a battery SOC measurement. The recording medium includes a measurement function for measuring a pack voltage and a pack current of the battery, a calculation function for calculating a total amount of discharge accumulation using the measured pack current, a determination function for determining a TAC of the battery from the total amount of discharge accumulation, and a calculation function for calculating a SOC of the battery based on the TAC and the pack current.

BRIEF DESCRIPTION OF THE DRAWINGS

A more complete appreciation of the invention and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE EMBODIMENTS

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

Throughout this specification and the claims which follow, unless explicitly described to the contrary, the word "comprise/include" or variations such as "comprises/includes" or "comprising/including" will be understood to imply the inclusion of stated elements but not the exclusion of any other elements.

Figure 1:
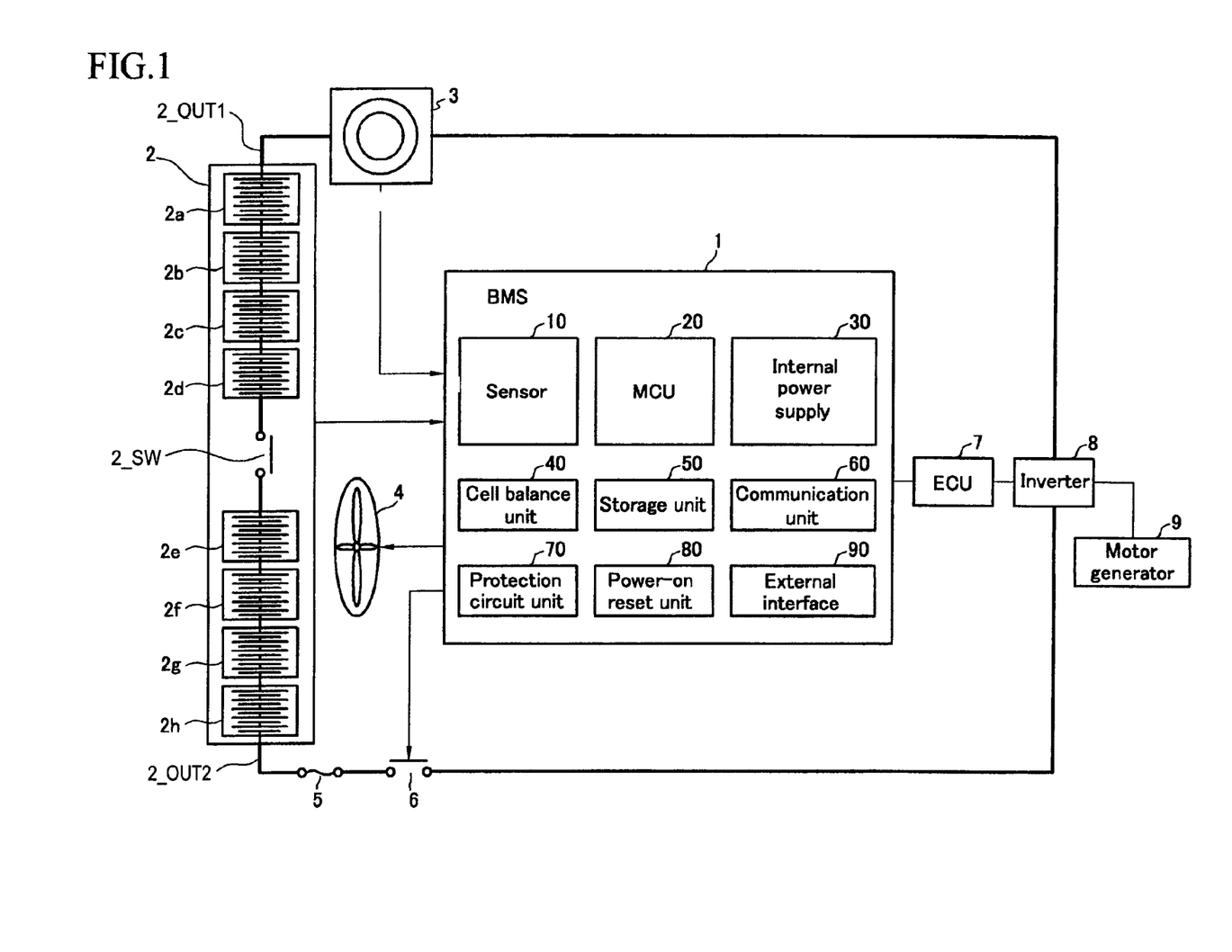
FIG. 1 schematically illustrates a vehicle system that uses electrical energy constructed as an exemplary embodiment of the present invention.

FIG. 1 schematically shows a vehicle system that uses electrical energy according to an exemplary embodiment of the present invention. As shown in FIG. 1, a vehicle system includes battery management system (BMS) 1, battery 2, current sensor 3, cooling fan 4, fuse 5, main switch 6, engine control unit (ECU) 7, inverter 8, and motor generator 9.

Battery 2 includes a plurality of sub-packs 2a to 2h, each of which is formed of a plurality of battery cells coupled in series with each other, output terminals 2_OUT1 and 2_OUT2, and safety switch 2_SW provided between sub-pack 2d and sub-pack 2e. Herein, eight sub-packs 2a to 2h are exemplarily illustrated, and each sub-pack is formed by grouping a plurality of battery cells in one group, but this is not restrictive and any number of sub-packs could be used. Safety switch 2_SW is provided between sub-pack 2d and sub-pack 2e, and is manually turned on or turned off for a user's safety when the user changes a battery or performs a battery-related operation. In the present exemplary embodiment, safety switch 2_SW is provided between sub-pack 2d and sub-pack 2e, but this is not restrictive. Safety switch 2_SW could be placed between any other sub-packs. Output terminals 2_OUT1 and 2_OUT2 are coupled to inverter 8.

Current sensor 3 measures an amount of output current of battery 2, and outputs the measured result to sensor 10 of BMS 1. In more detail, current sensor 3 may be a Hall current transformer (Hall CT) that measures an amount of output current by using a Hall element and outputs an analog current signal corresponding to the measured amount of the output current.

Cooling fan 4 reduces heat generated during charging/discharging process of battery 2 in response to a control signal from BMS 1, and prevents deterioration and reduction of charge/discharge efficiency of battery 2, which are otherwise caused by an increase of temperature of battery 2.

Fuse 5 prevents an over-current, which may be caused by a disconnection or a short circuit of battery 2, from being transmitted to battery 2. That is, when there is current overload in the circuit that connects to battery 2, fuse 5 disconnects the circuit so as to interrupt the flow of current.

Main switch 6 turns on/off electricity provided from battery 2 in response to a control signal from BMS 1 or in response to a control signal from ECU 7 in an unusual environment such as unusually high voltage, over-current, and high temperature.

BMS 1 includes sensor 10, main control unit (MCU) 20, internal power supply 30, cell balance unit 40, storage unit 50, communication unit 60, protection circuit unit 70, power-on reset unit 80, and external interface 90. Sensor 10 measures current (pack current) and voltage (pack voltage) of an entire battery pack, voltage of each battery cell, temperature of each battery cell, and temperature of peripherals. Sensor 10 measures a range of an input packet voltage by controlling a differential amplifier, and estimates packet current by using a hole sensor. Sensor 10 transmits the measured values of the parameters listed above to MCU 20. MCU 20 determines a state of charge (SOC) and a state of health (SOH) of battery 2 based on the measured values transmitted from sensor 10, and generates information on the state of battery 2. MCU 20 transmits the information to ECU 7 of the vehicle system. Accordingly, ECU 7 of the vehicle system controls charge or discharge of battery 2 based on the SOC or SOH delivered from MCU 20.

Internal power supply 30 supplies power to BMS 1 from a backup battery. Cell balance unit 40 balances the state of charging of each cell. That is, cells that are over-charged are discharged, and cells that are relatively less charged are further charged. Storage unit 50 stores data of a current SOC or SOH when the power source of BMS 1 is turned off. Herein, an electrically erasable programmable read-only memory (EEPROM) may be used for storage unit 50. Communication unit 60 communicates with ECU 7 of the vehicle system. Protection circuit 70 protects battery 2 from external impact, over-current, or low voltages, and is controlled by firmware. Power-on reset unit 80 resets the entire system when the power source of BMS 1 is turned on. External interface 90 couples auxiliary devices of BMS 1, including cooling fan 4 and main switch 6, to MCU 20. In the present exemplary embodiment, cooling fan 4 and main switch 6 are illustrated as the auxiliary devices of BMS 1, but this is not restrictive. Another type of device could be added as an auxiliary device of BMS 1.

ECU 7 determines the amount of torque that is required to drive a vehicle based on vehicle information such as state of an accelerator, state of a brake, or speed of the vehicle, etc., and controls an output of motor generator 9 in accordance with the determined torque. ECU 7 controls a switch of inverter 8 to control the output of the motor generator 9 that is determined in accordance with the determined torque. Another function of ECU 7 is to control charge and discharge of battery 2. ECU 7 receives the SOC of battery 2 from MCU 20 through communication unit 60 of the BMS 1, and controls the SOC of battery 2 to reach a target value (e.g., 55%). For example, when the SOC transmitted from MCU 20 is lower than 55%, ECU 7 controls the switch of the inverter 8 to make electric power flow toward battery 2 from another power source such as fuel cells, a generator connected to a combustion engine, or another battery installed in the vehicle. Therefore, battery 2 is charged. At this time, a pack current, which is measured by current sensor 3, may have a positive (+) value. When the SOC is higher than 55%, ECU 7 controls the switch of inverter 8 to make electric power to flow to motor generator 9, and therefore battery 2 is discharged. At this time, the pack current may have a negative (−) value. Inverter 8 charges or discharges battery 2 in response to a control signal of ECU 7.

Based on the torque information transmitted from ECU7, motor generator 9 drives the vehicle by using electrical energy of battery 2. That is, ECU 7 prevents over-charging or over-discharging of battery 2 by controlling charging/discharging of battery 2 within an allowable range on the basis of the SOC information to thereby efficiently use battery 2 for a longer time. Because it is difficult to directly measure SOC after battery 2 is installed in the vehicle, BMS 1 indirectly measures the SOC by using the pack current and pack voltage, which are detected by sensor 10, as input parameters, and delivers the SOC to ECU 7. In this method, BMS 1 could measure an accurate SOC of battery 2.

Figure 2:
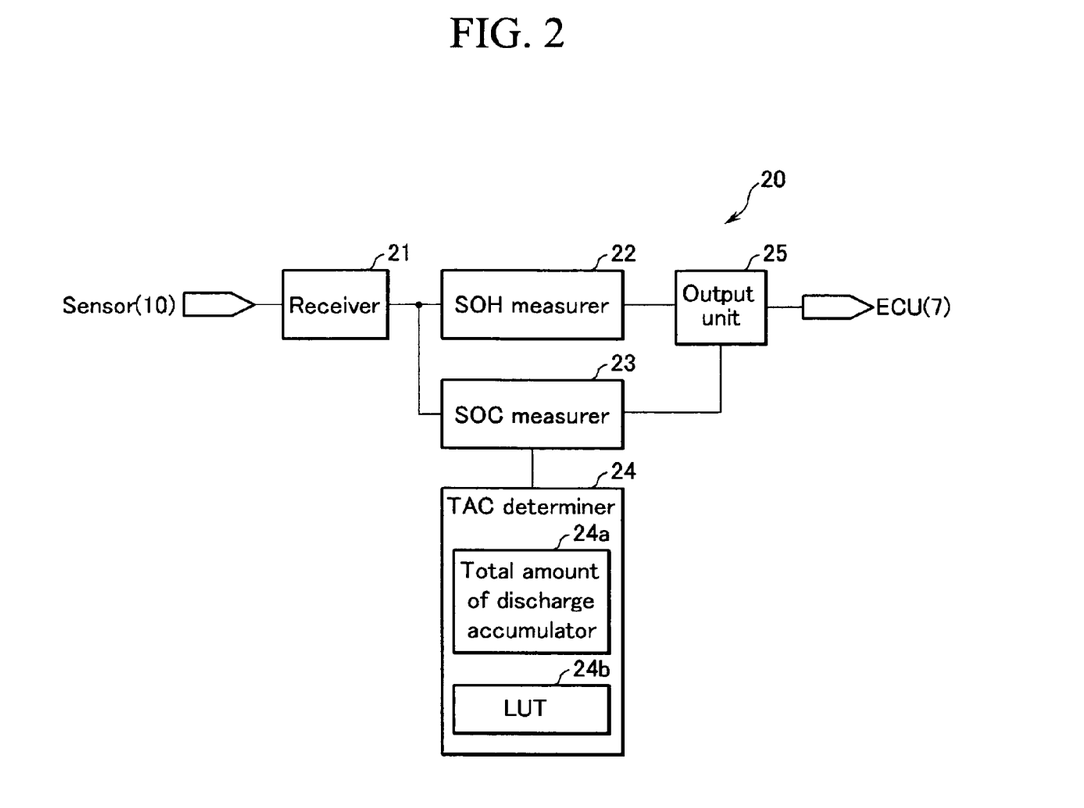
FIG. 2 schematically illustrates a main control unit (MCU) of a battery management system (BMS) constructed as an exemplary embodiment of the present invention.

MCU 20 of the exemplary embodiment of the present invention will now be described in more detail with reference to FIG. 2. FIG. 2 schematically shows MCU 20 of BMS1 constructed as the exemplary embodiment of the present invention.

As shown in FIG. 2, MCU 20 includes receiver 21, state of health (SOH) measurer 22, state of charge (SOC) measurer 23, total amount of charge (TAC) determiner 24, and output unit 25. Receiver 21 receives information on the state of battery 2, such as pack current, pack voltage, and temperature of battery or peripherals, which are measured by sensor 10 shown in FIG. 1. Total amount of charge (TAC) implies rated capacity of a battery. In more detail, TAC according to the exemplary embodiment of the present invention implies the amount of discharged energy with a specific current intensity from a fully charged battery.

SOH measurer 22 receives pack current, pack voltage, and temperature from receiver 21, and outputs a SOH value of battery 2 to output unit 25. SOC measurer 23 receives pack current from receiver 21, calculates a SOC from the pack current, and outputs a SOC value of battery 2 to output unit 25. The formula to obtain a SOC from the received pack current is presented in Equation 1 as follows.

$$SOC = \frac{\int (i \times \eta) dt}{TAC} \times 100[\%],$$ [Equation 1]

where i denotes a pack current of a charging/discharging current, η denotes charging/discharging efficiency of battery 2, and TAC denotes a total amount of charge.

Since it is difficult for BMS 1 to measure an accurate total amount of charge of battery 2, TAC determiner 24 determines a total amount of charge of battery 2 based on a total amount of discharge accumulation. TAC determiner 24 includes total amount of discharge accumulator 24a and look-up table (LUT) 24b. Total amount of discharge accumulator 24a employs an Ampere-hour counting algorithm to calculate the total amount of discharge accumulation. In the Ampere-hour counting algorithm, the total amount of discharge is calculated by accumulating the multiplications of a pack current of battery 2 by time, while BMS1 is in operation (a turn-on state of the power of BMS1) and battery 2 is in a state of discharge. Herein, the pack current during the discharge process is defined as a discharge pack current, and the time period during which the discharge takes place is defined as a discharge time period. Therefore, in the other words, the total discharge amount is calculated by integrating a discharge pack current over time during a discharge time period. As described above, the sign of the pack current is positive (+) during the discharge time period. If the power of BMS1 is turned off, TAC determiners 24 stores the total amount of discharge accumulation, which is calculated during operation of BMS 1, in storage unit 50.

LUT 24b stores a look-up table that shows a relationship between a total amount of charge and a total amount of discharge accumulation. A relationship between the total amount of charge and the total amount of discharge accumulation is experimentally obtained, and the method of obtaining the relationship will be described later in more detail.

TAC determiner 24 determines the total amount of charge by looking up the table stored in the LUT 24b, which shows a relationship between the total amount of discharge accumulation and the total amount of charge of battery 2. TAC determiner 24 periodically delivers the total amount of charge to SOC measurer 23. For example, TAC determiner 24 may deliver a total amount of charge to SOC measurer 23 each time when the total amount of discharge accumulation increases by 100 Ampere-hour.

Output unit 25 receives a SOH and a SOC of battery 2 from SOH measurer 22 and SOC measurer 23, respectively, and outputs the SOH and SOC to ECU 7

As described above, a total amount of charge of battery 2 is determined from a total amount of discharge accumulation, the relationship of which has been experimentally obtained, and a SOC of battery 2 is calculated by using the total amount of charge. Therefore the SOC of battery 2 can be more accurately measured according to the method described in the exemplary embodiment of the present invention.

Figure 3:
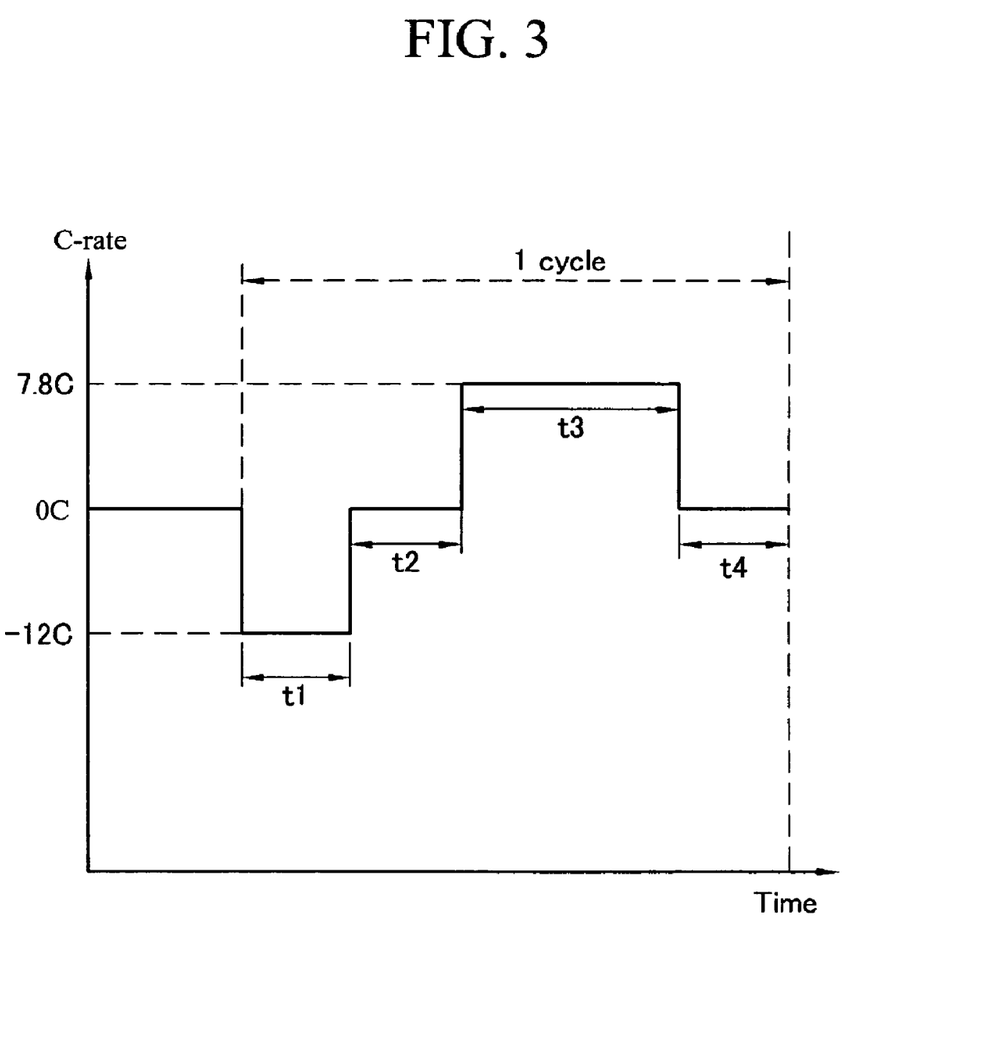
FIG. 3 is a graph showing a current profile applied to a battery for calculation of a total amount of discharge accumulation.
Figure 4:
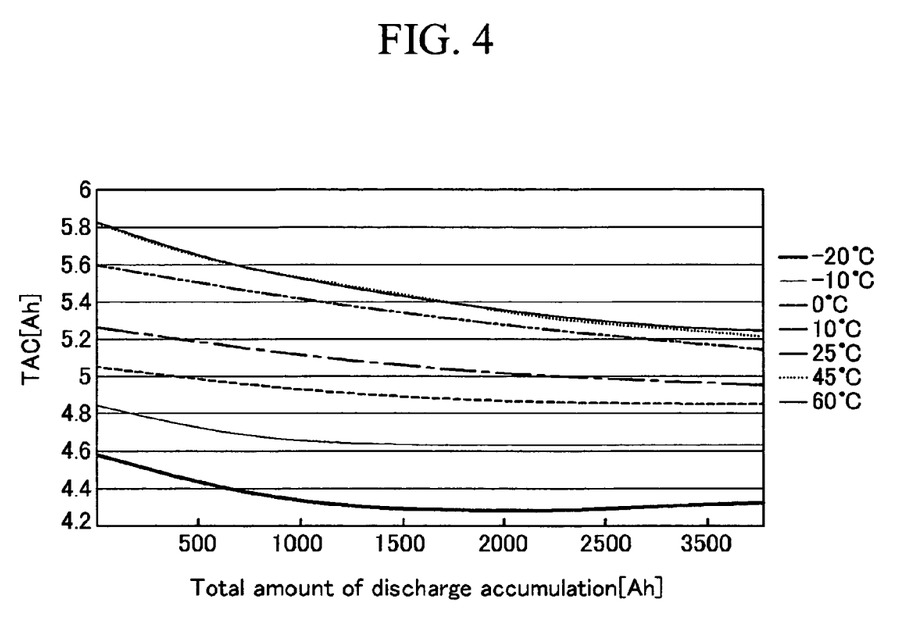
FIG. 4 is a graph showing a relationship between a total amount of discharge accumulation and a total amount of charge.

A method of obtaining the relationship between the total amount of charge and the total amount of discharge accumulation, which is stored in LUT 24b, will now be described in more detail with reference to FIG. 3 and FIG. 4. FIG. 3 is a graph showing a current profile applied to battery 2 for calculation of the total amount of discharge accumulation, and FIG. 4 is a graph showing the relationship between the total amount of charge and the total amount of discharge accumulation.

The charge current and discharge current of a battery is measured in C-rate which represents the amount of charge/discharge current in relation to a battery capacity. That is, in the case that a battery is charged at a C-rate of 1 C, the battery is fully charged after one hour, and in the case that the battery is discharged at a C-rate of 1 C, the battery is fully discharged after one hour. The C-rate determines a rate of charge/discharge to fully charge or discharge the battery in one hour.

As shown in FIG. 3, one cycle in the current profile is defined to include four periods of time t1, t2, t3, and t4. C-rate is represented as positive for charging, and negative for discharging. Battery 2 is discharged at 12 C during the period t1, and charged at 7.8 C during the period t3, while remaining at the same charged state at the periods t2 and t4 without charging or discharging.

Herein, the time t1 may be set to 9 seconds, the time t2 to 10 seconds, the time t3 to 15 seconds, and the time t4 to 10 seconds, but these are not restrictive and any value of time could be set for the time periods t1, t2, t3, and t4. In this example, the amount of discharge during one cycle is calculated by Equation 2. Here, C denotes a unit of C-rate, h an hour, and Ah Ampere-hour (Ampere times hour).

$$C_1 = 12[C] \times \frac{9}{3600}[h] = 0.03[Ah].$$ [Equation 2]

When this cycle is repeated 10,000 times at room temperature (about 25° C.), the corresponding total amount of discharge accumulation ($C_{10,000}$) can be calculated by Equation 3.

$$C_{10,000} = C_1 \times 10,000 = 0.03 \times 10,000 = 300[Ah].$$ [Equation 3]

After repeating the cycle 10,000 times, a total amount of charge of the battery is experimentally obtained, and measured to be 5.5 Ampere-hour. The experimentally obtained total amount of charge is a total amount of charge of the battery that corresponds to the total amount of discharge accumulation of 300 Ampere-hour. In order to measure the total amount of charge of the batter, the battery is fully charged after repeating the cycle 10,000 times, and then the battery is completely discharged. The steps of fully charging and fully discharging the battery may be performed several times. The total amount of charge may be measured by measuring the amount of discharge during the last step of fully discharging the battery. In this manner, a total amount of charge of 5.5 Ampere-hour is obtained when a total amount of discharge accumulation is 300 Ampere-hour at room temperature.

The total amount of charge, for example, can be experimentally measured by repeating the cycle 20,000 times, 40,000 times, 60,000 times, or 100,000 times at −20° C., −10° C., 0° C., 45° C., or 60° C. In this method, the temperature dependent relationship between the total amount of discharge accumulation and a total amount of charge could be obtained.

FIG. 4 is a graph showing a relationship between the total amount of discharge accumulation and a total amount of charge, which is measured through the above-described experiments. Then a look-up table containing the relationships between the total amount of discharge accumulation and the total amount of charge is stored in the LUT 24$b$. As described above, according to the above-described exemplary embodiment of the present invention, an accurate SOC can be obtained by using the Equation 1, pack current, and the total amount of charge (TAC) that is found from the relationships between the total amount of discharge accumulation and the total amount of charge.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A battery management system, comprising:
    a sensor for detecting a pack current and a pack voltage of a battery, the pack current of the battery including a charge current and a discharge current, the battery having only the discharge current during a discharge time period;
    a state of health measurer coupled to the sensor to receive the pack current and the pack voltage, and measuring a state of health of the battery from both of the pack current and the pack voltage;
    a state of charge measurer coupled to the sensor to receive the pack current;
    a total amount of charge determiner coupled to the state of charge measurer, the total amount of charge determiner obtaining a total amount of discharge accumulation by integrating the pack current of the battery only during the discharge time period, the total amount of charge determiner determining a total amount of charge from a relationship between the total amount of charge and the total amount of discharge accumulation, the total amount of charge determiner delivering the information of the total amount of charge to the state of charge measurer, the state of charge measurer measuring a state of charge from both of the pack current and the total amount of charge of the battery; and
    an output unit coupled to both of the state of health measurer and the state of charge measurer, and receiving the state of health and the state of charge.

2. The battery management system of claim 1, comprised of the total amount of charge determiner comprising:
    a total amount of discharge accumulator for obtaining the total amount of discharge accumulation; and
    a look-up table including the relationship between the total amount of charge and the total amount of discharge accumulation, the total amount of charge determiner looking up the look-up table to determine the total amount of charge from both of the total amount of discharge accumulation and the relationship of the look-up table.

3. The battery management system of claim 2, comprised of the total amount of charge determiner delivering the information of the total amount of charge to the state of charge measurer either periodically with a predetermined time interval or each time when the total amount of discharge accumulation is changed by a predetermined value.

4. The battery management system of claim 2, comprised of the relationship of the look-up table including a plurality of sub-relationships between the total amount of charge and the total amount of discharge accumulation at predetermined temperatures.

5. The battery management system of claim 1, wherein the state of charge measurer measures the state of charge by using a formula of $$SOC = \frac{\int (i \times \eta) dt}{TAC} \times 100[\%],$$

where i denotes the pack current, η denotes a charging/discharging efficiency of the battery, and TAC denotes the total amount of charge of the battery.

6. The battery management system of claim 1, comprised of the output unit outputting the state of health and the state of charge to an engine control unit of a vehicle that uses electrical energy.

7. A method for measuring a state of charge of a battery employed to a battery management system, the method comprising:
    measuring a pack voltage and a pack current of the battery, the pack current of the battery including a charge current and a discharge current, the batter having only the discharge current during a discharge time period;
    obtaining a total amount of discharge accumulation by integrating the pack current of the battery only during the discharge time period;
    determining a total amount of charge from a relationship between the total amount of charge and the total amount of discharge accumulation;
    measuring a state of charge of the battery from both of the total amount of charge and the pack current.

8. The method of claim 7, comprised of the step of measuring the state of charge of the battery including a step of obtaining the state of charge by the use of a formula of $$SOC = \frac{\int (i \times \eta) dt}{TAC} \times 100[\%],$$

where i denotes the pack current, η denotes a charging/discharging efficiency of the battery, and TAC denotes the total amount of charge.

9. The method of claim 7, comprised of the step of determining the total amount of charge including a step of looking up a look-up table that includes the relationship between the total amount of charge and the total amount of discharge accumulation.

10. A recording medium used in a battery management system for measuring a state of charge of a battery, the recording medium comprising:

a measurement function for measuring a pack voltage and a pack current of the battery, the pack current of the battery including charge current and a discharge current, the battery having only the discharge current during discharge time period;

a calculation function for calculating a total amount of discharge accumulation by integrating the pack current of the battery only during the discharge time period;

a determination function for determining a total amount of charge of the battery from a relationship between the total amount of charge and the total amount of discharge accumulation; and a calculation function for calculating a state of charge of the battery from both of the total amount of charge and the pack current.

11. The recording medium of claim 10, further comprising a look-up table including the relationship between the total amount of charge and the total amount of discharge accumulation.

12. The recording medium of claim 11, comprised of the determination function for determining the total amount of charge of the battery determining the total amount of charge by looking up the relationship included in the look-up table.

13. The recording medium of claim 10, comprised of the calculation function for calculating the state of charge of the battery including a formula of $$SOC = \frac{\int (i \times \eta) dt}{TAC} \times 100[\%],$$

where i denotes the pack current, $\eta$ denotes a charging/discharging efficiency of the battery, and TAC denotes the total amount of charge.

* * * * *